United States Patent
Bruce et al.

(10) Patent No.: US 6,770,333 B2
(45) Date of Patent: Aug. 3, 2004

(54) METHOD OF CONTROLLING TEMPERATURE DURING COATING DEPOSITION BY EBPVD

(75) Inventors: Robert W. Bruce, Loveland, OH (US); Antonio F. Maricocchi, Loveland, OH (US); Roger D. Wustman, Loveland, OH (US); Karl S. Fessenden, Wilder, KY (US); John D. Evans, Springfield, OH (US)

(73) Assignee: General Electric Company, Schenectady, NY (US)

( * ) Notice: Subject to any disclaimer, the term of this patent is extended or adjusted under 35 U.S.C. 154(b) by 158 days.

(21) Appl. No.: 10/063,494

(22) Filed: Apr. 30, 2002

(65) Prior Publication Data

US 2003/0203127 A1 Oct. 30, 2003

(51) Int. Cl.[7] .............................................. C23C 14/30
(52) U.S. Cl. .................. 427/596; 427/255.32; 427/318
(58) Field of Search ............................ 427/596, 255.32, 427/248.1, 318

(56) References Cited

U.S. PATENT DOCUMENTS

| | | | |
|---|---|---|---|
| 3,617,375 A | 11/1971 | Marek et al. ................ | 117/217 |
| 4,184,448 A | * 1/1980 | Aichert et al. .............. | 118/729 |
| 4,208,042 A | 6/1980 | Aichert et al. .............. | 266/242 |
| 4,514,437 A | 4/1985 | Nath ........................... | 427/39 |
| 4,681,773 A | 7/1987 | Bean .......................... | 427/38 |
| 4,828,872 A | 5/1989 | Bauer et al. ................. | 427/39 |
| 4,926,439 A | 5/1990 | Johnson et al. .............. | 373/10 |
| 5,008,897 A | 4/1991 | Crumley ....................... | 373/11 |
| 5,656,141 A | 8/1997 | Betz et al. ................ | 204/298.05 |
| 6,319,569 B1 | * 11/2001 | Callaway et al. ........... | 427/585 |

FOREIGN PATENT DOCUMENTS

EP          969117 A2 * 1/2000 ........... C23C/14/08

OTHER PUBLICATIONS

U.S. patent application Ser. No. 09/624,809, Bruce et al., filed Jul. 24, 2000.

* cited by examiner

Primary Examiner—Timothy Meeks
(74) Attorney, Agent, or Firm—David L. Narciso; Gary M. Hartman; Domenica N. S. Hartman

(57) ABSTRACT

A method of operating an EBPVD apparatus (10) to deposit a ceramic coating on an article (20), such that the thermal conductivity of the coating is both minimized and stabilized. More particularly, the EBPVD apparatus (10) is operated to perform multiple successive coating operations which together constitute a coating campaign. During the campaign, the surface temperatures of the articles (20) being coated do not exceed about 1000° C. as a result of the combined heat transfer from the coating chamber (14) to the articles (20) being reduced during the course of the campaign, even though the temperature within the coating chamber (14) continuously rises during successive coating operations of the campaign. Ceramic coatings deposited at such relatively low temperatures exhibit lower and more stable thermal conductivities.

20 Claims, 1 Drawing Sheet

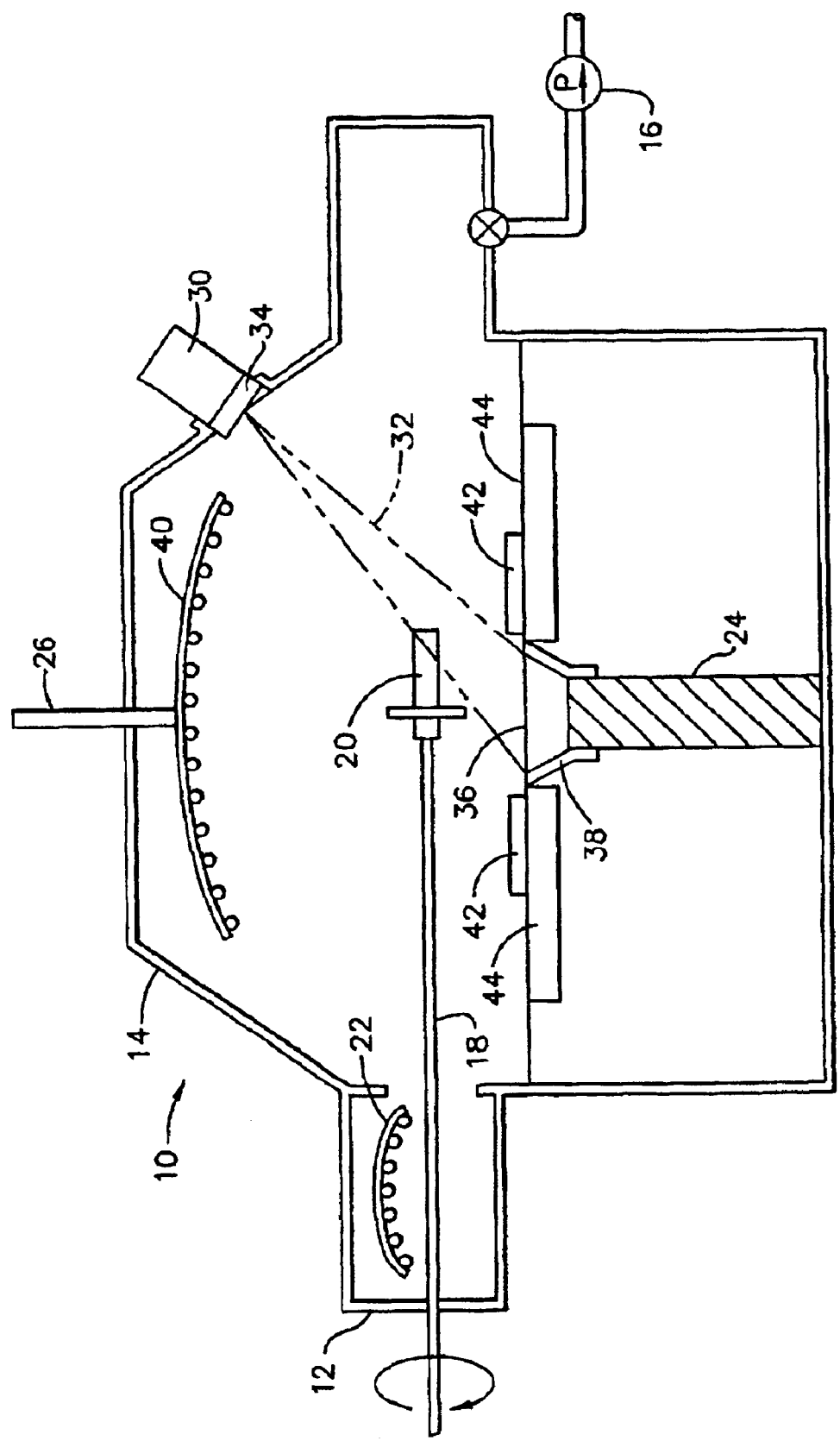

METHOD OF CONTROLLING TEMPERATURE DURING COATING DEPOSITION BY EBPVD

BACKGROUND OF INVENTION

1. Field of the Invention

The present invention generally relates to electron beam physical vapor deposition (EBPVD) processes and equipment. More particularly, this invention relates to such an EBPVD apparatus and process for depositing ceramic coatings, in which process temperatures are controlled in a manner that reduces the thermal conductivity of the deposited coatings.

2. Description of the Related Art

Components located in certain sections of a gas turbine engine, such as the turbine, combustor and augmentor, are often provided with thermal barrier coatings (TBC) to minimize their service temperatures. To be effective, thermal barrier coatings must have low thermal conductivity and adhere well to the component surface. Various ceramic materials have been employed as the TBC, with zirconia ($ZrO_2$) stabilized by about seven weight percent yttria ($Y_2O_3$), or 7% YSZ, being widely employed because of its ability to be readily deposited by plasma spraying and vapor deposition techniques. An example of the latter is electron beam physical vapor deposition (EBPVD), which produces a TBC having a columnar grain structure that is able to expand with its underlying substrate without causing damaging stresses that lead to spallation. Adhesion of the TBC to the component can be further enhanced by the presence of a metallic bond coat, such as a diffusion aluminide or an oxidation-resistant resistant alloy such as MCrAlY, where M is iron, cobalt and/or nickel.

Processes for producing TBC by EBPVD generally entail preheating a component, typically to about 1100° C., and then placing the component in a heated coating chamber maintained at a subatmospheric pressure, often about 0.005 mbar. The component is supported in proximity to an ingot of the desired coating material (e.g., YSZ), and an electron beam is projected onto the ingot so as to melt the surface of the ingot and produce a vapor of the coating material that deposits onto the component. Temperature ranges within which EBPVD processes can be performed depend in part on the component and coating materials. Minimum process temperatures are generally established to ensure the coating material will suitably evaporate and deposit on the component to form a coating that exhibits adequate thermal fatigue properties, while maximum process temperatures are typically limited by the requirement to avoid microstructural damage to the component material. For YSZ deposited on nickel-base superalloys, a suitable temperature range is about 925° C. to about 1125° C. A stable component surface temperature promotes the desired columnar grain structure for the TBC.

Advanced EBPVD apparatuses permit batch coating operations, in which coated components are removed from the coating chamber and preheated uncoated components are then placed in the coating chamber without shutting down the apparatus, so that a continuous operation is achieved. The continuous operation of the apparatus during this time can be termed a "campaign," with greater numbers of components successfully coated during the campaign corresponding to greater processing and economic efficiencies. An example of a particularly efficient EBPVD apparatus is disclosed in commonly-assigned U.S. patent application Ser. No. 09/624,809 to Bruce et al. Throughout the deposition process, the temperature within an EBPVD coating chamber continues to rise as a result of the electron beam and the presence of a molten pool of the coating material. For this reason, EBPVD coating processes are often initiated near the targeted minimum process temperature and then terminated when the coating chamber nears the maximum process temperature, at which time the coating chamber is cooled and cleaned to remove coating material that has deposited on the interior walls of the coating chamber.

A suitable thickness for a TBC is dependent in part on the thermal conductivity of the TBC material. While greater thicknesses are more thermally protective of the underlying substrate, the amount of TBC deposited on a component must often be limited to minimize weight, particularly for rotating components of gas turbine engines. Various approaches have been proposed for minimizing thermal conductivities of TBC's to allow for the use of thinner coatings without sacrificing thermal protection. For example,. commonly-assigned U.S. Pat. No. 6,447,854 to Rigney et al. discloses an EBPVD process in which the coating chamber is maintained at a pressure as high as about 0.020 mbar to produce a TBC with reduced thermal conductivity. Commonly-assigned U.S. Pat. No. 6,342,278 to Rigney et al. discloses an EBPVD process for depositing TBC materials with reduced thermal conductivities, attributed to the coating chamber being maintained at pressures of about 0.010 mbar or more with an oxygen partial pressure of greater than 50%, preferably at or close to 100%.

In addition to an initially low thermal conductivity, it is important that the thermal conductivity of a TBC remain low throughout the life of the component on which it is deposited. However, thermal conductivities of TBC materials such as YSZ have been observed to increase by 30% or more over time when subjected to the high temperatures within a gas turbine engine. This increase has been associated with microstructural instability, including coarsening of the zirconia-based microstructure through grain and pore growth and grain boundary creep. To compensate for this phenomenon, TBC's for gas turbine engine components are often deposited to a greater thickness than would otherwise be necessary. Alternatively, internally cooled components such as blades and nozzles must be designed to have higher cooling flow.

In view of the above, it can be appreciated that further improvements in TBC technology are desirable, particularly as TBC's are employed to thermally insulate components intended for more demanding engine designs.

SUMMARY OF INVENTION

The present invention is a method of operating an EBPVD apparatus to deposit a ceramic coating (e.g., TBC) on an article, such that the thermal conductivity of the coating is both minimized and stabilized. More particularly, the EBPVD apparatus is operated so that the surface temperatures of the articles being coated do not exceed about 1000° C. during deposition of the ceramic coating on the second article. According to one aspect of the invention, ceramic coatings deposited at such relatively low temperatures exhibit lower and, surprisingly, more stable thermal conductivities.

The method of this invention generally entails operating an EBPVD apparatus to perform multiple successive coating operations, which together constitute a coating campaign. The method comprises performing a first coating operation during which one or more articles are placed in a coating chamber in which a subatmospheric pressure is maintained, and an electron beam gun is operated to project an electron beam into the coating chamber and onto a ceramic material, with the electron beam heating, melting and evaporating the ceramic material to deposit a ceramic coating on the articles. The first coating operation is carried out so that the surface temperatures of the articles do not exceed about 1000° C. during deposition of the ceramic coating. The procedure is then repeated for one or more subsequent coating operations, throughout which surface temperatures of the articles being coated remain at or below about 1000° C.

To maintain such low temperature throughout a coating campaign, steps are taken so that the combined heat transfer to the articles processed in the subsequent coating operation occurs at a heat transfer rate that is lower than the heat transfer rate for the articles processed in the first coating operation. The lower heat transfer rate serves to maintain the surface temperatures of the articles at or below about 1000° C. during deposition of the ceramic coating, even though the temperature within the coating chamber, attributable at least in part to thermal radiation from the coating chamber and the molten ceramic material, continuously rises during successive coating operations. By maintaining surface temperatures at or below about 1000° C., the deposited ceramic coatings have been shown to exhibit lower thermal conductivities, on the order of about 20% lower, that remain stable when subjected to high temperatures, such as found in the hot gas path of a gas turbine engine.

Other objects and advantages of this invention will be better appreciated from the following detailed description.

BRIEF DESCRIPTION OF DRAWINGS

FIG. 1 is a front cross-sectional view representing an electron beam physical vapor deposition apparatus used to deposit a coating material in accordance with this invention.

DETAILED DESCRIPTION

An EBPVD apparatus 10 in accordance with this invention is schematically depicted in FIG. 1, in which various components and features of the apparatus 10 are represented. The apparatus 10 is particularly intended for depositing a ceramic TBC on a superalloy component intended for operation within a thermally hostile environment. Notable examples of such components include the high and low pressure turbine nozzles and blades, shrouds, combustor parts and augmentor hardware of gas turbine engines. While the advantages of this invention will be described with reference to depositing a TBC on such components, the teachings of this invention can be generally applied to a variety of coating materials and components.

FIG. 1 represents a coating process in which a ceramic coating is being deposited on one or more turbine blades 20. Turbine blades and other gas turbine engine components are typically formed of nickel-base or cobalt-base superalloys. Prior to coating with the apparatus 10, the surfaces of the components 20 are typically provided with an aluminum-containing bond coat, as known in the art. Also prior to depositing the TBC, the surface of the bond coat can be grit blasted to clean its surface and produce an optimum surface finish required for depositing columnar EBPVD ceramic coatings. An alumina scale is then formed on the bond coat at an elevated temperature to promote adhesion of the TBC. The alumina scale, often referred to as a thermally grown oxide, or TGO, develops from oxidation of the aluminum-containing bond coat either through exposure to an elevated temperature prior to or during deposition of the ceramic coating, or by way of a high temperature treatment specifically performed for this purpose. While various materials could be used as the coating material, a preferred material for TBC on gas turbine engine components is zirconia ($ZrO_2$) partially or fully stabilized by yttria (e.g., 3%–20%, preferably 4%–8% $Y_2O_3$), though yttria stabilized with magnesia, ceria, calcia, scandia or other oxides could be used. The coating operation within the apparatus 10 continues until the desired thickness for the coatings is obtained.

For purposes of illustrating the invention, the EBPVD apparatus 10 is shown as including a preheat chamber 12 and a coating chamber 14. However, the apparatus 10 could have any number of coating and preheat chambers, and will typically include one or more loading chambers through which the components 20 are initially loaded before being introduced into the preheat and coating chambers 12 and 14. As known in the art, a loading chamber would be aligned with the preheat chamber 12, and the components 20 loaded on a rake 18 that transfers the components 20 into the preheat chamber 12 and then the coating chamber 14. With additional loading and preheat chambers, multiple loading and preheating stages can occur simultaneously while components 20 are being coated within the coating chamber 14. According to a preferred aspect of this invention, multiple loading and preheat chambers are provided in accordance with commonly-assigned U.S. patent application Ser. No. 09/624,809 to Bruce et al., whose disclosure is incorporated herein by reference.

As is conventional, the preheat and coating chambers 12 and 14 are maintained at a subatmospheric pressure, preferable at a vacuum level of about up to 20 mbar in accordance with commonly-assigned U.S. Pat. No. 6,447,854 to Rigney et al. A pumping system 16, which may include mechanical, cryogenic and/or diffusion pumps of types known in the art, is employed to evacuate the preheat and coating chambers 12 and 14 (and the loading chamber). The desired deposition pressure is obtained by evacuating the preheat and coating chambers 12 and 14, and then introducing an inert gas (such as argon) and, Optionally, oxygen into the chambers 12 and 14 until the targeted process pressure is obtained.

The preheat chamber 12 is shown as being equipped with a preheating element 22 that serves to heat the components 20 before being transferred into the coating chamber 14, where coating is performed. The components 20 are preferably preheated to a temperature of higher than 1000° C., such as about 1100° C., which allows for cooling of the components 20 from the time they leave the preheat chamber 12 until the deposition process starts in the coating chamber 14. Coating deposition occurs by melting and evaporating an ingot 24 of the desired ceramic material with an electron beam 32 produced by an electron beam (EB) gun 30. The EB gun 30 is represented as being equipped with a deflection device 34 to appropriately deflect and focus the beam 32 of electrons on the upper surface of the ingot 24. The deflection device 34 can be of any suitable type, such as an electrostatic or electromagnet device. Intense heating of the ceramic material by the electron beam 28 causes the surface of the ingot 24 to melt, forming a molten ceramic pool 36 from which molecules of the ceramic material evaporate, travel upwardly, and then deposit on the surfaces of the components 20, producing the desired ceramic coating whose thickness will depend on the duration of the coating process. As indicated in FIG. 1, the rake 18 can be rotated to promote the uniformity of the coatings deposited on the components 20. While a single ingot 24, gun 30 and beam 32 are shown in FIG. 1, it is within the scope of this invention that the EBPVD apparatus 10 could be equipped with multiple ingots and EB guns, and that all ingots could be evaporated simultaneously or in any groupings at any given time.

During a given coating campaign, multiple coating operations are performed with different sets of components 20, with the coating operations being performed one after the other without interrupting the operation of the EB gun 30. As a result, the molten pool 36 of ceramic material is continuously maintained during the successive coating operations, and as a result the temperatures of the ingot 24 and the coating chamber 14 continuously rise throughout the successive coating operations of the campaign. In the past, component surface temperatures during the first coating operation of a coating campaign would be near the lower limit identified for acceptable coatings, e.g., about 925° C. for YSZ, and the campaign would be terminated following a later coating operation in which surface temperatures are near some preestablished upper limit, e.g., about 1125° C. for YSZ on superalloy components.

In contrast to previous practices, the EBPVD apparatus 10 is shown in FIG. 1 to include several features that, alone or in any combination, can be used to maintain a relatively low temperature within the coating chamber 14, and therefore lower and more consistent component surface temperatures during the deposition process. According to a particularly preferred aspect of the invention, the surface temperatures of components 20 coated during a coating campaign is maintained at a temperature of not higher than about 1000° C. In an investigation leading up to the present invention, nickel-base superalloy components were coated with 7% YSZ by EBPVD in which six process parameters were varied to determine their effect on the thermal conductivity of the deposited coatings: component surface temperature, chamber pressure, rotation of the components, gas flow, gas composition and deposition evaporation) rate. Of these, surface temperature was found to have a significant effect on coating conductivity. For example, the coefficients of thermal conductivity of 7% YSZ deposited on components with surface temperatures of about 1000° C. averaged about 1.45 W/m·K, which was about 20% lower than the coefficient of about 1.80 W/m·K measured for identical coatings deposited under identical conditions but on components whose surface temperatures were about 1100° C. Surprisingly, the reduced thermal conductivities exhibited by these coatings persist even after being subjected to temperatures sustained by components in the hot gas path of a gas turbine engine. In the investigation, after a thermal treatment of about two hours at about 1200° C., the thermal conductivities of those components coated at about 1000° C. increased to an average thermal conductivity of about 1.68 W/m·K, or an increase of about 16%. Under the same treatment, those components coated at about 1100° C. increased to an average thermal conductivity of about 2.05 W/m·K, or an increase of about 13%. From this investigation, it was concluded that surface temperatures below 1100° C., and more preferably at or below 1000° C., was preferred when depositing YSZ as a thermal barrier coating.

One technique for maintaining acceptable low component surface temperatures is to equip the coating chamber 14 with a heating element 40 positioned above the components 20. The heating element 40 can be of any suitable type, such as an externally-powered radiant heating device or a reflector plate that radiates heat emitted by the molten pool 36 of the ingot 24 back toward the components 20. According to this aspect of the invention, the heating element 40 is operated to have a decreasing heating effect on the components 20 as successive coating operations of a campaign are performed, during which time the temperature within the coating chamber 14 continuously rises as a result of heating of the interior of the chamber 14 by the electron beam 32, the molten pool 36 of coating material, etc. If in the form of an externally powered device, the element 40 can be operated at a relatively high level at the beginning of a campaign, during which the temperature of the coating chamber 14 is relatively low, after which the heat output of the element 40 is gradually reduced during the course of the campaign. Alternatively or in addition, the heating element 40 can be positioned relatively close to the components 20 with an actuator 26 to maximize heating of the components 20 at the beginning of a campaign, and then moved away from the components 20 as the temperature within the coating chamber 14 rises during the campaign to reduce heat transfer from the element 40 to the components 20. The latter technique is also effective if the heating element 40 is in the form of a simple reflector plate. Alternatively or in addition, if a reflector plate is used, a coolant can be caused to flow through the heating element 40 as the temperature within the coating chamber 14 rises during the campaign to reduce the temperature of the heating element 40 and therefore reduce the amount of heat radiated from the element 40 to the components 20. In each case, the components 20 can be readily brought to an acceptable minimum deposition temperature at the start of a campaign, while attainment of the maximum allowed temperature of 1000° C. is delayed to maximize the length of the coating campaign.

Another feature for achieving a more consistent component surface temperature of not higher than about 1000° C. during the deposition process is through the placement of reflectors 42 near the crucible 38. The reflectors 42 are depicted as being plates that can be coated with a ceramic or other suitable reflective material, though the reflectors 42 could be a ceramic or ceramic-coated granular material, or for convenience, pieces of an ingot of the same material as the ingot 24. Due to their proximity to the crucible 38, the reflectors 42 are at a very high temperature during the coating process, and therefore radiate heat upward toward the components 20. The reflectors 42 are shown as being supported on plates 44 that are preferably fluid-cooled so as not to appreciably radiate heat to the components 20. The temperature of the reflectors 42, and therefore the amount of heat radiated by the reflectors 42, are inherently at a maximum toward the end of a coating campaign. According to the invention, the temperatures of the reflectors 42 can be minimized toward the end of the campaign by increasing the flow rate of coolant through the plates 44, thereby absorbing heat at a greater rate from the reflectors 42 during a coating operation at the end of the campaign as compared to the rate of heat absorption during a subsequent coating operation at the beginning of the campaign. Alternatively or in addition, the reflectors 42 can be positioned closer to the components 20 during the first coating operation of a campaign, and then removed from the coating chamber 14 or repositioned farther from the components 20 later during the campaign to reduce the amount of radiant heating of the components 20 attributable to the reflectors 42. The reflectors 42 can be used alone or in conjunction with the heating element 40 to regulate the temperature of components 20 being coated within the coating chamber 14 during an ongoing campaign.

Another technique by which the surface temperatures of components can be maintained within the desired temperature range during a coating campaign is through the operation of the EB gun 30. For example, the EB gun 30 can be operated at a higher power level during the first coating operation of a campaign, and subsequently at successively lower power levels as required during the campaign to reduce heating of the components 20 attributable to the EB gun 30 and the molten pool 36 of ceramic material maintained by the electron beam 32. Alternatively or in addition, the EB gun 30 can be operated to project the electron beam 32 over a larger surface area of the ingot 24 (molten pool 36) at the beginning of a coating campaign and successively smaller surface areas during the course of the campaign. If the reflectors 42 are formed of a material with a sufficiently high melting temperature, the electron beam 32 or a separate beam (not shown) could be projected onto the reflectors 42 to further promote radiant heating by the reflectors 42 at the beginning of a campaign. The operation of the EB gun 30 can be used alone or in conjunction with one or more of the other techniques.

In view of the above, the present invention provides several techniques that can be used alone or in combination so that the combined heat transfer from the coating chamber 14 (i.e., surfaces of the chamber 14) and the ingot (i.e., the molten pool 36) to the components 20 occurs at a higher heat transfer rate during the first coating operation of a coating campaign than during later coating operations of the same coating campaign, with the intent that the surface temperatures of the components 20 processed during the campaign are not higher than about 1000° C. while the ceramic coating (TBC) is deposited on the components 20. According to a preferred aspect of the invention, the result is a TBC with a reduced and more stable coefficient of thermal conductivity.

While the invention has been described in terms of a preferred embodiment, it is apparent that other forms could be adopted by one skilled in the art. Accordingly, the scope of the invention is to be limited only by the following claims.

What is claimed is:

1. A method of operating an electron beam physical vapor deposition coating apparatus, the method comprising the steps of:
   performing a first coating operation during which:
      at least a first article is placed in a coating chamber in which a gas-containing atmosphere is contained, the gas-containing atmosphere being at a first temperature and at a subatmospheric pressure; and
      an electron beam gun is operated to project an electron beam into the coating chamber and onto a ceramic material, the electron beam heating, melting and evaporating the ceramic material to deposit a ceramic coating on the first article;
      wherein combined heat transfer to the first article from sources other than the gas-containing atmosphere within the coating chamber occurs at a first heat transfer rate while the first article is within the coating chamber, so that a surface temperature of the first article does not exceed about 1000° C. during deposition of the ceramic coating on the first article; and
   subsequently performing a second coating operation during which:
      at least a second article is placed in the coating chamber while the gas-containing atmosphere within the coating chamber is at a subatmospheric pressure and at a second temperature that is higher than the first temperature; and
      the electron beam gun is operated to project the electron beam into the coating chamber and onto the ceramic material to heat, melt and evaporate the ceramic material and deposit a ceramic coating on the second article;
      wherein combined heat transfer to the second article from sources other than the gas-containing atmosphere within the coating chamber occurs at a second heat transfer rate that is lower than the first heat transfer rate while the second article is within the coating chamber, so that a surface temperature of the second article does not exceed about 1000° C. during deposition of the ceramic coating on the second article.

2. A method according to claim 1, further comprising the step of preheating the first and second articles prior to being placed in the coating chamber.

3. A method according to claim 2, wherein the first and second articles are preheated to a temperature higher than 1000° C.

4. A method according to claim 2, wherein the first and second articles are preheated to a temperature of about 1100° C.

5. A method according to claim 1, wherein the first and second heat transfer rates are achieved at least in part by operating the electron beam gun at a higher power during the first coating operation than during the second coating operation.

6. A method according to claim 1, wherein the first and second heat transfer rates are achieved at least in part by operating the electron beam gun to project the electron beam onto a larger surface area during the first coating operation than during the second coating operation.

7. A method according to claim 1, wherein the first and second heat transfer rates are achieved at least in part by operating a heat-generating means within the coating chamber during the first coating operation, and reducing the heat output of the heat-generating means during the second coating operation.

8. A method according to claim 1, wherein the first and second heat transfer rates are achieved at least in part by positioning at least one heat-reflecting means a first distance from the first article during the first coating operation, and repositioning the heat-reflecting means to be a second distance from the second article during the second coating operation, the second distance being greater than the first distance.

9. A method according to claim 1, wherein the first and second heat transfer rates are achieved at least in part by at least one heat-reflecting means located in the coating chamber and means for cooling the heat-reflecting means, the cooling means maintaining the heat-reflecting means at a first reflection temperature during the first coating operation and at a second reflection temperature during the second coating operation, the first reflection temperature being higher than the second reflection temperature.

10. A method according to claim 1, wherein the first and second surface temperatures of the first and second articles are between about 925° C. and about 1000° C.

11. A method according to claim 1, wherein the coating material is yttria-stabilized zirconia.

12. A method according to claim 1, wherein the coating material is zirconia stabilized by about seven weight percent yttria.

13. A method according to claim 1, wherein the first and second articles are gas turbine engine components.

14. A method of operating an electron beam physical vapor deposition coating apparatus, the method comprising a plurality of successive coating operations by which thermal barrier coatings are deposited on gas turbine engine components during each of the coating operations, each of the coating operations comprising the steps of:

preheating the components to a preheat temperature;

placing the components in a coating chamber in which a gas-containing atmosphere is contained, the gas-containing atmosphere being at an elevated temperature and at a subatmospheric pressure; and operating an electron beam gun to project an electron beam into the coating chamber and onto at least one ingot of yttria-stabilized zirconia, the electron beam heating, melting and evaporating the ingot to deposit the thermal barrier coatings on the components;

wherein the electron beam is operated so that a molten pool of yttria-stabilized zirconia is continuously maintained during the successive coating operations and the temperatures of the ingot and the gas-containing atmosphere of the coating chamber continuously rise during the successive coating operations;

wherein combined heat transfer to the components from radiant sources other than the gas-containing atmosphere of the coating chamber occurs at a first heat transfer rate during a first of the coating operations, so that surface temperatures of the components are between about 925° C. and about 1000° C. during deposition of the thermal barrier coatings on the components during the first coating operation; and wherein combined heat transfer to the components from radiant sources other than the gas-containing atmosphere of the coating chamber occurs at a second heat transfer rate that is lower than the first heat transfer rate during a last of the coating operations, so that surface temperatures of the components are between about 925° C. and about 1000° C. during deposition of the thermal barrier coatings on the components during the last coating operation.

15. A method according to claim 14, wherein the preheat temperatures during the first and last coating operations are higher than 1000° C.

16. A method according to claim 14, wherein the first and second heat transfer rates are achieved at least in part by operating the electron beam gun at a higher power during the first coating operation than during the last coating operation.

17. A method according to claim 14, wherein the first and second heat transfer rates are achieved at least in part by operating the electron beam gun to project the electron beam over a larger surface area of the ingot during the first coating operation than during the last coating operation.

18. A method according to claim 14, wherein the first and second heat transfer rates are achieved at least in part by operating a heat-generating means within the coating chamber during the first coating operation, and reducing the beat output of the heat-generating means during the last coating operation.

19. A method according to claim 14, wherein the first and second heat transfer rates are achieved at least in part by positioning at least one heat-reflecting means a first distance from the components during the first coating operation, and repositioning the heat-reflecting means to be a second distance from the components during the last coating operation, the second distance being greater than the first distance.

20. A method according to claim 14, wherein the first and second heat transfer rates are achieved at least in part by at least one heat-reflecting means located in the coating chamber and means for cooling the heat-reflecting means, the cooling means maintaining the heat-reflecting means at a first reflection temperature during the first coating operation and at a second reflection temperature during the last coating operation, the first reflection temperature being higher than the second reflection temperature.

* * * * *